United States Patent

Fujiyama et al.

[11] Patent Number: 5,888,293
[45] Date of Patent: Mar. 30, 1999

[54] MATERIAL SUPPLIED FOR FABRICATING SINGLE-CRYSTAL SEMICONDUCTOR

[75] Inventors: Tatsuhiro Fujiyama; Hiroshi Inagaki, both of Hiratsuka; Hidetoshi Kurogi, Omura, all of Japan

[73] Assignee: Komatsu Electronic Metals Co., Ltd., Hiratsuka, Japan

[21] Appl. No.: 773,377

[22] Filed: Dec. 26, 1996

[51] Int. Cl.$^6$ .................................................. C30B 15/02
[52] U.S. Cl. ............................ 117/13; 117/22; 117/33; 117/214; 117/911; 117/932
[58] Field of Search ............................ 117/33, 214, 911, 117/932, 13, 22

[56] References Cited

U.S. PATENT DOCUMENTS 5,009,864  4/1991  Ibe .......................................... 117/214

*Primary Examiner*—Robert Kunemund
*Attorney, Agent, or Firm*—Varndell Legal Group

[57] ABSTRACT

A low-cost and high productivity charging material is provided for use in the recharge or additional charge fabrication of single-crystal semiconductor by means of the CZ method. Common polysilicon rods utilized in recharge or additional charge fabrication have their end portions formed into ring grooves. A joint element is made of silicon. When the end portions of the rods contact, the joint element engages the grooves to connect the rods together along their longitudinal direction. The rods can have arbitrary length, whereas the total weight, including the joint element, must be adjusted by the length to be greater than those of the melted polysilicon and the suspending portions.

9 Claims, 4 Drawing Sheets

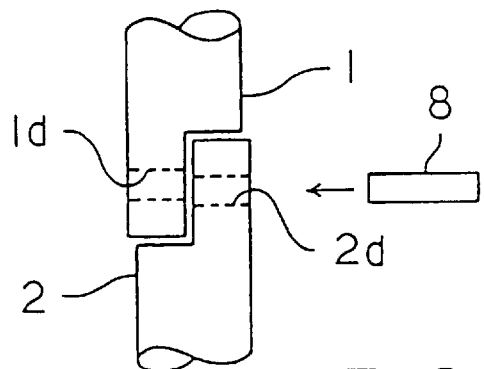
FIG. 9
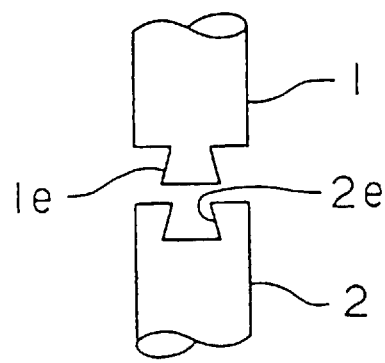
FIG. 10
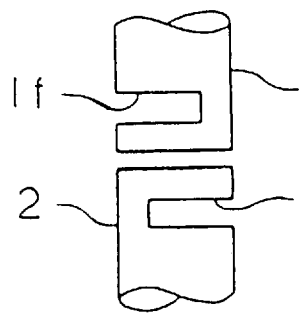 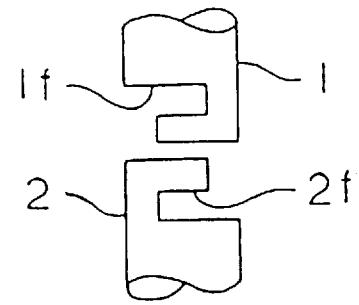
FIG. 11A    FIG. 11B

MATERIAL SUPPLIED FOR FABRICATING SINGLE-CRYSTAL SEMICONDUCTOR

BACKGROUND OF THE INVENTION

1. Field of the Invention

The present invention relates to materials supplied for fabricating single-crystal semiconductor, and more specifically, to a recharging or additional charging material supplied for fabricating single-crystal semiconductor by the Czhocralsky method (CZ method).

2. Description of Related Art

The substrate of semiconductor devices is generally of high purity single-crystal silicon which is, in general, fabricated by the CZ method. In the CZ method, polysilicon is charged in the crucible of a single-crystal pulling apparatus, in which the polysilicon is melted by heaters arranged around the crucible. In the method, a seed, which is appended to a seed holder, is immersed in the melted polysilicon and rotated in counter to or in the same direction as that of the crucible, the single-crystal is formed when the seed holder is pulled from the crucible.

As the required dimensions of the semiconductor wafer increased, large single-crystal silicon rods with a diameter greater than six inches have become main stream in the semiconductor industry recently. Therefore, the dimensions of the single-crystal silicon pulling apparatus have accordingly expanded and the processing amount per one batch process tends to increase. However, the time required to fabricate the single-crystal silicon also increases as the apparatus dimensions expand. Moreover, certain pre- and post-formation processes, such as melting more polysilicon in a larger crucible before the fabrication of single-crystal silicon and cooling the crucible to an appropriate temperature for cleaning after the fabrication of single-crystal silicon, require more processing time. All these requirements reduce the efficiency of single-crystal silicon fabrication.

The recharge method is one way to improve the fabrication efficiency of single-crystal silicon. This method recharges polysilicon in the crucible and melts the recharged polysilicon when the single-crystal silicon has been pulled out. When the recharge method is utilized, the cooling time and cleaning time of the elements and chambers in the pulling apparatus can be saved, and the quartz crucible, which must be replaced after formation of a single-crystal rod in the conventional fabrication method, can be reused, thus reducing the manufacturing cost. Moreover, an additional charge method can be utilized to feed additional polysilicon into the crucible when previous charged polysilicon is melted, thus increasing the melt amount and facilitating the fabrication of a longer single-crystal silicon rods of larger diameter.

In the recharge or additional charge process, as the polysilicon rods are provided for charge material, one end of each rod has a ring groove which can append to an suspending jig attached to a pulling axis or pulling cable of the single-crystal pulling apparatus, thus feeding the rods into the melt in the crucible. When the recharge or additional charge method is utilized to fabricate single-crystal rods of a large diameter, the amount of melted polysilicon should be increased, therefore larger or longer polysilicon rods are required.

However, certain problems arise as the larger or longer polysilicon rods are utilized. The problems are as follows.

1. The manufacturing cost of larger polysilicon rods is generally much higher because of their low growth rate and of poor yield due to cracks occurred during the growing process. Moreover, any valve through which the polysilicon rod is inserted into the pulling apparatus limits the dimensions of the rod. For example, the inert diameter of the gate valve connecting the main chamber to the pulling chamber and the diameter of the regulation pipe for conducting inert gas from upper portion of the pulling chamber to the main chamber are quite small, thus limiting the dimensions of the rods in the pulling apparatus. When two polysilicon rods of general dimension are combined to be melted in the crucible, they are constrained by the minimal diameter of the valves that they pass through.

2. If the large-dimensional polysilicon rods are not preprocessed by heating before being melted or not cooled after they melted with more times than the times usually required, the rods may break and drop in the crucible, thus increasing the time required to melt the rods and reducing the efficiency. For example, a polysilicon rod having a diameter of 120 mm and a length of 510 mm drops at a speed of 100 mm/sec to a distance of 20 mm from the melt surface in a crucible. The diameter of the crucible is 18 inches, and in the crucible remains 25 Kg of melt. If the polysilicon rod is pre-heated for 30 minutes, it will crack, and most of it will fall into the melt. For if only 30 mm of the polysilicon rod remains, and the remaining portion is pulled at a speed of 50 mm/sec from the chamber, the remaining portion has a high temperature of 504° C., with a variation of 58° C. between the highest and lowest temperatures.

3. As compared with common rods, the enlarged rods and rods of specific length are more expensive. Moreover, utilizing the enlarged rods, after charging in the crucible, leaves end portions which require a plenty of time to make good of them.

4. Not only novel apparatus for suspending the enlarged polysilicon rods, but cleaning and handling apparatus are required, thus increasing the manufacturing cost.

5. As the rod dimensions are expanded, the workability becomes extremely worse in making grooves before cleaning, the chamber cleaning, handling in resolving step and other processing steps cannot be efficiently carried out.

SUMMARY OF THE INVENTION

Accordingly, the present invention provides a material for recharging or additionally charging in the fabrication of single-crystal silicon by means of the CZ method, thereby reducing the manufacturing cost and improving production efficiency.

The material of the present invention is for fabricating single-crystal semiconductor by the CZ method and is characterized in that a plurality of polysilicon rods, which are provided for recharging or additionally charging materials, can be connected by engaging polysilicon joint elements to the joints at end portions of the rods. Or, the plurality of polysilicon rods can be connected by engaging the Joints at end portions of the rods.

As stated above, since the plurality of polysilicon rods can be connected by engaging joint elements to the joints at the end portions of the rods, the charging material for the fabrication of large-dimensional single-crystal rods can be supplied as one rod material. Moreover, the same effect can be attained by engaging the joints of the polysilicon rods without the joint elements.

BRIEF DESCRIPTION OF THE INVENTION

FIG. 9 is a schematic diagram of the joint portion of the material of a fifth embodiment of the present invention;

FIG. 10 is a schematic diagram of the joint portion of the material of a sixth embodiment of the present invention; and FIG. 11A and FIG. 11B are schematic diagrams of the joint portion of the material of a seventh embodiment of the present invention.

DETAILED DESCRIPTION OF THE INVENTION

Figure 1:
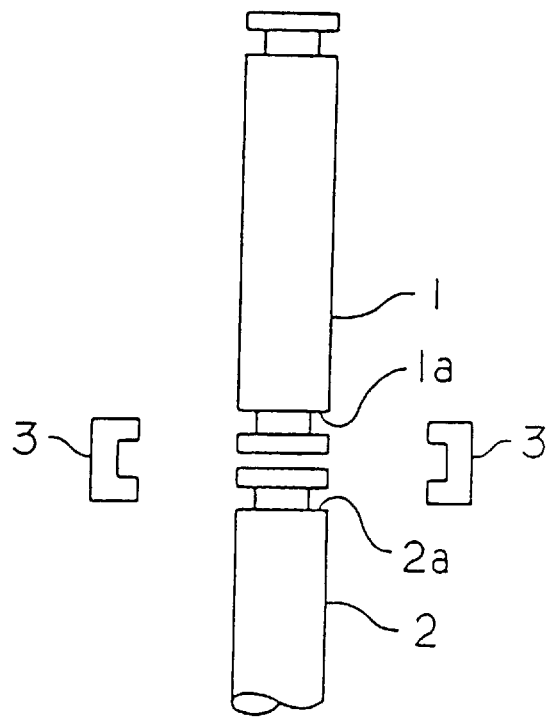
FIG. 1 is a schematic diagram illustrating the material according to a first embodiment of the present invention.
Figure 2:
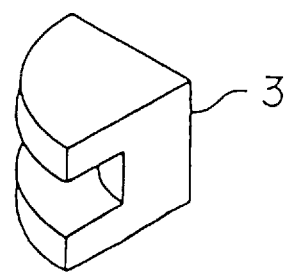
FIG. 2 is a schematic diagram illustrating the joint element of the first embodiment.
Figure 3A:
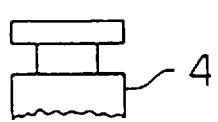
FIG. 3A through FIG. 3C illustrate the manufacturing steps of the material of FIG. 1.
Figure 3B:
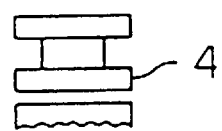
Figure 3C:
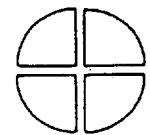

The embodiments of the present invention will be described in accompaniment with the drawings. FIG. 1 is a schematic diagram illustrating at least two rods which are connected as charging material in the first embodiment. FIG. 2 illustrates the joint element which is provided for engaging the rods. FIG. 3A through FIG. 3C illustrate the process steps for fabricating the joint element.

Rods 1 and 2 are polysilicon rods having a diameter suitable for the general recharge, additional charge or continuous charge method (i.e., about 80 mm). These rods have their end portions processed to form grooves 1a and 2a. The grooves 1a and 2a are formed with a shape similar to that of the grooves for suspending the rods. The joint elements 3, which are made of silicon, are engaged between the groove 1a of the rod 1 and the groove 2a of the rod 2 by their extruding portions, thus connecting the rods 1 and 2 along the longitudinal direction. The lengths of rods 1 and 2 can be arbitrary, whereas the total length of the charge material should be adjusted so that its weight, including the joint elements, is equal to that of the melted polysilicon and the appended portions.

FIG. 3A illustrates an remainder portion 4 of the melted polysilicon rod. The joint element of the present invention is thus fabricated from the remainder portion 4. That is, as shown in FIG. 3B, the lower portion of the remainder portion 4 is cut away, and the upper portion or the groove portion is modified as desired. Therefore, four joint elements 3 of FIG. 2 are formed as shown in FIG. 3C.

Figure 4:
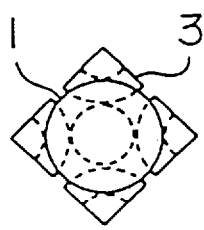
FIG. 4 is a top view of two rods joined by means of four joint elements.

FIG. 4 is a top view of four joint elements 3 which are connected to the rods. As the joint elements 3 engage the grooves at the end of the rods, even though the outer rim of the engaged region extrudes, they can still pass through the smallest hole of the pulling apparatus. If the dimension of the engaged region tends to exceed the hole dimension, a hole along the longitudinal direction in the center of the remaining portion 4 of FIG. 3B can be formed before its separation into four elements, thereby decreasing the diameter of the engaged region. Moreover, a set of 2–4 joint elements can be utilized to connect the rods.

Figure 5:
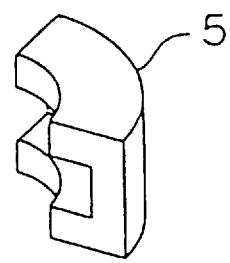
FIG. 5 illustrates the joint element according to a second embodiment of the present invention.

FIG. 5 is a perspective view of the joint element of the second embodiment of the present invention. The joint element 5, which is made of polysilicon rods, connects the rod 1 and the rod 2 by engaging the grooves thereof. In the second embodiment, the extruding portion of the engaged region is smaller.

Figure 6:
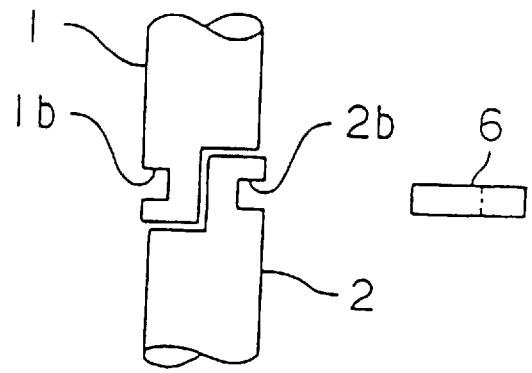
FIG. 6 illustrates the joint portion of the material of a third embodiment of the present invention.
Figure 7:
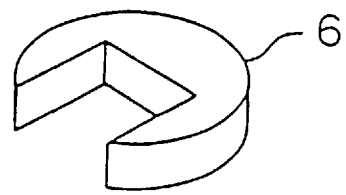
FIG. 7 is a schematic diagram of the joint element of the third embodiment.

FIG. 6 illustrates the joint portions of the charging material of the third embodiment of the present invention. FIG. 7 is a perspective view of the joint element. Alternate extruding portions are formed at ends of the rods 1 and 2, thus forming linear grooves 1b and 2b. When the extruding portions of the rods contact, the polysilicon joint element 6 of FIG. 7 can be engaged to the grooves 1b and 2b, thereby connecting the rods.

Figure 8:
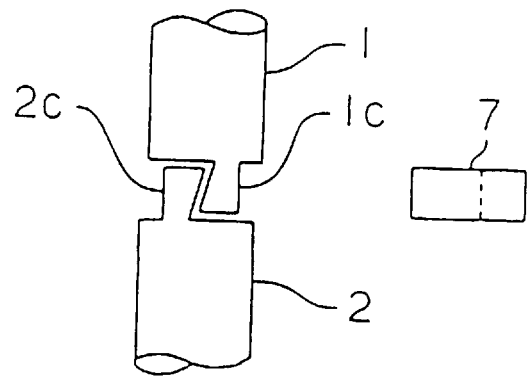
FIG. 8 is a schematic diagram of the joint portion of the material of a fourth embodiment of the present invention.

FIG. 8 illustrates the joint portions of the charging material of the fourth embodiment of the present invention. Alternate mesa regions 1c and 2c are formed at ends of the rods 1 and 2. When the mesa regions 1c and 2c make face-to-face contact, the joint element 7 can hold the mesa regions 1c and 2c to connect the rods. The joint element 7 is similar to that shown in FIG. 7.

FIG. 9 illustrates the joint portions of the charging material of the fifth embodiment of the present invention. Alternate extruding portions are formed at ends of the rods 1 and 2. Pinholes 1d and 2d are formed in the extruding portions of the rods 1 and 2, respectively. When the extruding portions contact, and a pin 8 is inserted through the pinholes 1d and 2d, the rods are connected together.

FIG. 10 is a perspective view of the joint portions of the charge material according to the sixth embodiment of the present invention. The rods can be connected directly by the end portions thereof without utilizing the joint element or the joint pin. In the present embodiment, the end portion of the rod 1 has a mesa extruding region 1e, and the end portion of the rod 2 has a groove region 2e. The rods 1 and 2 can be connected by engaging the extruding region 1e with the groove region 2e.

Moreover, the seventh embodiment of the present invention, as shown in FIG. 11A and FIG. 11B, has grooves 1f and 2f formed at end of the rods 1 and 2, respectively. The grooves 1f and 2f are perpendicular to the longitudinal direction of the rods. Therefore, the rods 1 and 2 can be connected by engaging the grooves 1f and 2f. The connected rods 1 and 2 of FIG. 11A have a shift from the common axis. It is acceptable if the connected rods can pass the smallest hole of the pulling apparatus. The rods of FIG. 11B coincide with the common axis when they connect, thereby becoming equivalent to an enlarged rod. Furthermore, a male screw can be installed at the end portion of one of the rods 1 and 2, and a female screw is installed at the other rod, thus connecting the rods by engaging the screws.

The charging material shown in FIG. 9, FIG. 10 and FIG. 11B can be utilized in the continuous charge method or FZ method for fabricating single-crystal silicon because there is no extruding or spacing in the material.

The charging material for the recharge method or additional charge method in the aforementioned embodiments is justified to illustrate, for example, whether it cracks when preprocessed by heating and its temperature drops when removed from the chamber after the melting of the charging material. The result is as follows.

1. A crucible, whose diameter is 18 inches, contains 25 Kg of melt. Six rods of charging material, each of which has a diameter of 80 mm and a length of 1200 mm (an 800 mm rod and a 400 mm rod are connected together), drop at a speed of 100 mm/sec to a position 20 mm above the melt surface in the crucible. The charging material is left there for 30 minutes for preprocessing by heating. As the rods do not crack, they will not drop in the melt. Whereas the half of the rods having a diameter of 120 mm have will cracked in the same conditions as those stated above.

2. Moreover, when the rods are melted to leave a 30 mm remainder portion, they are pulled out into the pull chamber at a speed of 50 mm/sec. After making a pressure of the pull chamber back to atmospheric pressure, a temperature of the remainder portion is measured. Their measured average temperature is about 412° C., which has a variation of 51° C. between the highest and the lowest temperature. The present temperature is obviously lower than that of the prior art, in which the 120 mm rods have a temperature of 504° C. As the average temperature is reduced by 92° C., the cooling time can also be decreased.

Accordingly, the present invention forms joint portions at the ends of the plurality of polysilicon rods provided as charging material for the recharge method or additional charge method, thereby connecting the rods by engaging the polysilicon joint elements with the joint portions or by engaging the joint portions directly. The present invention therefore provides the following advantages:

1. Since no large rod is utilized, the preprocessing and cooling time of the rods can be reduced, and the production efficiency is not affected.

2. Since high-cost large-dimension or enlarged rods is not utilized, the manufacturing cost can be reduced.

3. Common rods are utilized and their remainder portions are effectively re-utilized.

4. Since each of the common rods, before the connection, is lighter than the large-dimension and enlarged rods, the mechanical processing of the end portion, the cleaning process, and the installation of the rod to the pulling apparatus are more easily carried out.

5. Since common rods instead of large-dimension or enlarged rods are utilized, the present instruments for fabricating the single-crystal silicon, such as the apparatus for mechanical processing, cleaning, and other processing, can be employed, thereby preventing further investment in novel instruments.

What is claimed is:

1. A supply material for fabricating single-crystal semiconductor by the CZ method, which comprises a plurality of polysilicon rods for recharging or charging additional materials, and engaging silicon joint elements, the plurality of polysilicon rods respectively having end portions, and the engaging silicon joint elements joining together the end portions of adjacent polysilicon rods of the plurality of polysilicon rods.

2. The supply material for fabricating single-crystal semiconductor by the CZ method as set forth in claim 1, wherein the end portions of the polysilicon rods include engaging portions, and the adjacent polysilicon rods are joined together by respective engaging portions facing each other and the engaging silicon joint elements engaging the engaging portions.

3. The supply material for fabricating single-crystal semiconductor by the CZ method as set forth in claim 1, wherein the end portions of the polysilicon rods respectively have engaging ring grooves, and the adjacent polysilicon rods are joined together along a longitudinal direction thereof.

4. The supply material for fabricating single-crystal semiconductor by the CZ method as set forth in claim 1, wherein the engaging silicon joint elements are in the shape of a disk having engaging edges formed by a rectangular opening arranged in a center of the disk, the end portions of the polysilicon rods have a half-cylinder shape with a curved outer wall contiguous with a respective polysilicon rod and a flat wall intersecting an axis of the respective polysilicon rod, and the engaging grooves have a flat wall parallel with the flat wall of the half-cylinder shape, and the adjacent polysilicon rods are joined together by the engaging grooves of the end portions of the polysilicon rods receiving the engaging edges of the engaging silicon joint elements.

5. The supply material for fabricating single-crystal semiconductor by the CZ method as set forth in claim 1, wherein the engaging silicon joint elements are in the shape of a disk having engaging edges formed by a rectangular opening arranged in a center of the disk, the end portions of the polysilicon rods respectively have a projection extending in a longitudinal direction thereof, the projection including inner and outer walls, the inner wall extending at an angle relative the longitudinal direction of the polysilicon rod, and the outer wall is parallel with the longitudinal direction of the polysilicon rod, and the adjacent polysilicon rods are joined together by abutting the inner walls of the end portions of the adjacent polysilicon rods and the engaging edges of the engaging silicon joint elements passing over the outer walls of the end portions of the adjacent polysilicon rods.

6. The supply material for fabricating single-crystal semiconductor by the CZ method as set forth in claim 1, wherein the engaging silicon joint elements have a pin shape, the end portions of the polysilicon rods have a half-cylinder shape with a curved outer wall contiguous with a respective polysilicon rod and a flat wall intersecting an axis of the respective polysilicon rod, the end portions further including a transversely arranged hole relative to a longitudinal direction of the respective polysilicon rod, and the adjacent polysilicon rods are joined together by the respective flat walls abutting each other and the transversely arranged hole of the end portions of the adjacent polysilicon rods receiving the engaging silicon joint element.

7. A supply material for fabricating single-crystal semiconductor by the CZ method, which comprises a plurality of polysilicon rods for recharging or charging additional materials, the plurality of polysilicon rods respectively having end portions with engaging joints, and the plurality of polysilicon rods are joined together by the engaging joints of adjacent polysilicon rods of the plurality of polysilicon rods engaging each other.

8. The supply material for fabricating single-crystal semiconductor by the CZ method as set forth in claim 7, wherein the engaging joints of the end portions of the adjacent polysilicon rods respectively have a groove perpendicular to a longitudinal direction of the polysilicon rods forming an engaging projection extending perpendicular to the longitudinal direction, and the adjacent polysilicon rods are joined together by the engaging projection of a respective end portion of the adjacent polysilicon rods fitting within the groove of another respective end portion of the adjacent polysilicon rods.

9. The supply material for fabricating single-crystal semiconductor by the CZ method as set forth in claim 8, wherein the engaging projections respectively extend a distance less than a diameter of the polysilicon rods, so that the adjacent polysilicon rods are joined together with a common axis.

* * * * *